United States Patent
Lee

[11] Patent Number: 6,162,336
[45] Date of Patent: Dec. 19, 2000

[54] CLAMPING RING DESIGN TO REDUCE WAFER STICKING PROBLEM IN METAL DEPOSITION

[75] Inventor: Chin Fong Lee, Singapore, Singapore

[73] Assignee: Chartered Semiconductor Manufacturing Ltd., Singapore, Singapore

[21] Appl. No.: 09/351,239

[22] Filed: Jul. 12, 1999

[51] Int. Cl.[7] .......................... C23C 14/50; C23C 16/458
[52] U.S. Cl. .................. 204/298.15; 204/298.02; 204/298.09; 118/728; 118/721; 118/720; 118/715; 118/500; 118/503; 269/254 R; 269/903
[58] Field of Search .................. 204/298.15, 298.02, 204/298.09; 118/728, 721, 720, 715, 500, 503; 269/254 R, 903

[56] References Cited

U.S. PATENT DOCUMENTS

| | | | |
|---|---|---|---|
| 5,228,501 | 7/1993 | Tepman et al. | 165/80.1 |
| 5,421,401 | 6/1995 | Sherstinsky et al. | 165/80.2 |
| 5,460,703 | 10/1995 | Nulman et al. | 204/192.12 |
| 5,467,220 | 11/1995 | Xu | 359/350 |
| 5,484,011 | 1/1996 | Tepman et al. | 165/1 |
| 5,725,718 | 3/1998 | Banholzer et al. | 156/345 |
| 5,810,931 | 9/1998 | Stevens et al. | 118/721 |
| 5,925,226 | 7/1999 | Hurwitt et al. | 204/298.15 |
| 5,930,661 | 7/1999 | Lu | 438/584 |
| 5,942,041 | 8/1999 | Lo et al. | 118/728 |
| 5,958,198 | 9/1999 | Banholzer et al. | 204/298.15 |
| 6,012,509 | 1/2000 | Nonaka | 165/80.2 |

*Primary Examiner*—Alan Diamond
*Attorney, Agent, or Firm*—George O. Saile; Rosemary L. S. Pike

[57] ABSTRACT

A clamping ring design that eliminates the Wafer sticking problem. In the first embodiment of the present invention the wafer clamp ring is redesigned to sharply reduce the wafer to wafer-ring contact area. In the second embodiment of the present invention a clamp ring guide is added to prolong the lifetime of the clamp ring.

11 Claims, 2 Drawing Sheets

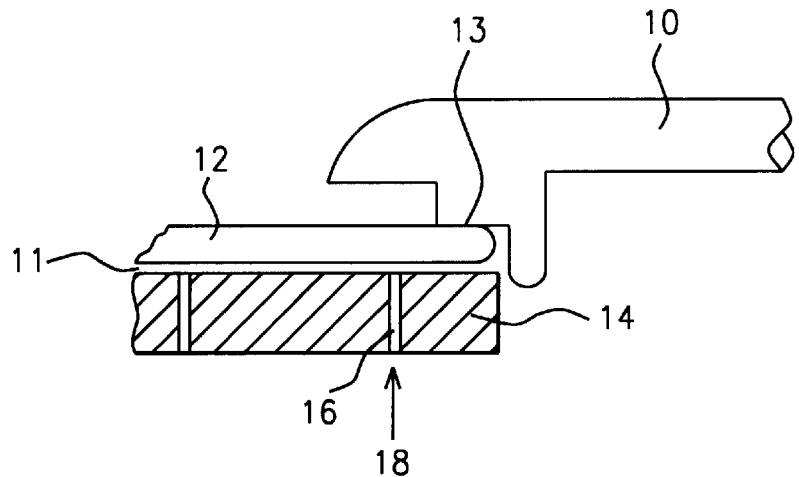
FIG. 1 - Prior Art
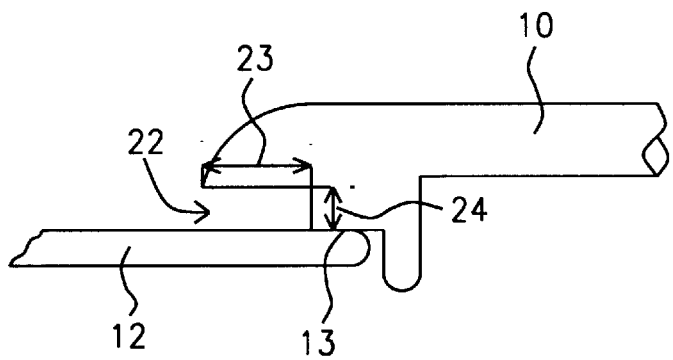
FIG. 2 - Prior Art
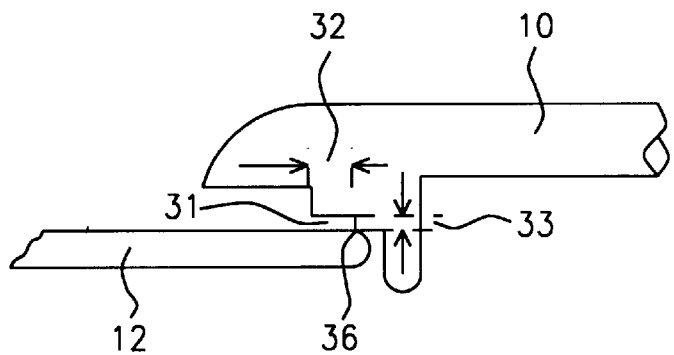
FIG. 3

CLAMPING RING DESIGN TO REDUCE WAFER STICKING PROBLEM IN METAL DEPOSITION

BACKGROUND OF THE INVENTION (1) Field of the Invention

The invention relates to the fabrication of semiconductor wafers, and more particularly to a method of eliminating the sticking of the wafer to the wafer clamp ring after wafer processing in excess of 120 Kilo Watt Hours (KWH's).

(2) Description of the Prior Art

It is required to secure a semiconductor wafer against movement during wafer processing. This securing or clamping of the semiconductor wafer assures the maintenance of repetitive and precise processing tolerances and thus insures improved wafer yields.

During Prior Art Physical Vapor Deposition (PVD) processing of the semiconductor wafer, a processing step used to deposit a metal film on the semiconductor wafer surface, a metal clamping ring 10, FIG. 1, is commonly used to secure the semiconductor wafer. Intense heat is generated in the clamping ring during this process due to the plasma generated during the process. This can lead to considerable expansion of the clamping ring. The area of contact between the clamping ring and the wafer must therefore be such that this expansion can be accommodated so that the inner diameter of the clamping does not equal or exceed the diameter of the wafer.

When processing a round wafer, a conventional wafer clamping arrangement, FIG. 1, secures wafer 12 to the wafer cooling pedestal 14 with a circular wafer clamping ring 10. The clamping ring 10 is used to press the edge of the wafer into the continuous sealing abutment with the upper surface of the wafer pedestal 14. A port 16 is provided to flow a supply of an inert coolant gas 18, such as argon, to the backside of the wafer to improve thermal transfer between the wafer and the heater chuck. This takes advantage of the large thermal mass of the heater chuck 14 relative to the wafer 12 for conducting temperature. In this way, a predictable and consistent temperature is maintained across the wafer surface during wafer processing, and the various process steps that are used to fabricate devices on the wafer surface may be carried out in a reliable manner.

During standard PVD processing, deposition of the metal film on the surface of the semiconductor wafer 12 results in deposition of a metal film on the surface of the clamping ring 10. This deposition alters the profile (height and inner diameter) of the clamping ring 10 which in turn results in the metal ring, that is its modified profile, being shadowed on the semiconductor wafer which is being processed. This shadowing has a negative effect on wafer yield and must therefore be restricted or eliminated.

During wafer processing electrical charges build up on the surface of the wafer between the wafer and the wafer pedestal. For instance, it is known that a negative charge can build up on back surface 11, FIG. 1, of the wafer 12 due to the presence of a DC plasma within the processing environment. The build up of such a charge on the wafer surface can have a serious detrimental effect since such a charge is of opposite polarity from the charge on the surface of the pedestal 14. This results in the wafer 12 sticking to the pedestal 14, removal of the wafer under these conditions can be time consuming and can result in wafer breakage or damage. The design of the clamping ring 10 is affected by this phenomena to the extent that the clamp ring 10, if it is properly manufactured using conductive material and if it is properly applied, can drain or eliminate the electrical charge between the back side 11 of the wafer 12 and the wafer pedestal 14 and in doing so help to prevent the wafer 12 from sticking to the wafer pedestal 14 due to electrical charges.

Also, the clamp ring arrangement which is currently used to clamp the wafer into the wafer processing tool encounters wafer sticking problems due to the build-up of extraneous material during the sputtering process in the wafer to wafer-clamp contact area 13. The accumulation of the extraneous material is a function of the length of the processing time and the power applied during the process, that is the process kilowatt-hours (KWH). The wafer-sticking problem limits the Process Kit (PK) time to 120 kWh on average.

Referring now more particularly to FIG. 2, this figure shows the Prior Art of wafer clamping. In this figure the wafer 12 is securely clamped down by the clamping ring 10 during wafer processing, the wafer clamping ring 10 has one cut-out or extrusion 22 with a cut-out width of 23 and cutout height of 24. Wafer 12 will maintain contact with clamping ring 10 at location 13 until the deposition is completed.

Typical dimensions for the cut-out sides are as follows: side 23 equals 1.5 mm.+−0.02 mm., side 24 equals 0.35 mm.+−0.02 mm.

The clamping ring 10 was examined after a problem of wafer sticking was observed; a layer of black film, which was deposited on the contact site, was analyzed. The average recorded Process Kit (PK) life up to the occurrence of the wafer sticking problem was 130 to 190 Kilo Watt Hours (kWh) for a 150 degrees Centigrade (C.) process and 110 kWh for a 500 degrees C. process.

U.S. Pat. No. 5,421,401 to Sherstinsky et al. teaches clamping a wafer to the wafer processing tool but limits itself to wafers having a flat portion while it has as objective to prevent leakage of coolant gases circulated at the back of the wafer into the process environment.

U.S. Pat. No. 5,467,220 to Xu teaches a wafer pedestal used to heat and cool a wafer during wafer processing by placing a yoke on top of the wafer clamp ring, this yoke provides a reflector which improves temperature uniformity across the wafer.

U.S. Pat. No. 5,460,703 to Nulman et al. teaches a clamping ring made of a thermally nonconductive material having a low thermal coefficient of expansion. Such material allows the production of a clamp ring having the largest possible diameter resulting in more wafer surface availability, reduced wafer shadowing due to metal film build-up on the clamp ring and improved wafer temperature uniformity.

U.S. Pat. No. 5,484,011 to Tepman et al. teaches a clamping ring with a temperature regulated platen for clamping a wafer to the platen but does not address the wafer-sticking problem.

U.S. Pat. No. 5,228,501 to Tepman et al. as above, for U.S. Pat. No. 5,1484,011.

SUMMARY OF THE INVENTION

The invention is a clamp ring having a compound configuration which defines an open inner area, as determined by the inner diameter of the clamping ring, to allow processing gasses, etc. to reach the surface of the wafer to be processed. The clamping ring has a shape and thickness that is adapted to coincide with the round portion of the semiconductor wafer edge and, when clamping the wafer to the wafer pedestal, to press the round portion of the wafer into a sealing abutment with the wafer pedestal.

The clamp ring exerts an even and continuous pressure around the entire edge of the wafer to establish and maintain a reliable and continuous seal at the wafer edge by providing a solid clamp surface at the round edge of the wafer. The invention provides a clamp ring with which argon gas leakage from the wafer backside is reduced and can be controlled while also allowing the clamp ring to be made from materials that are process compatible for most or all process environments.

A principle object of the present invention is to eliminate the wafer-sticking problem and to sharply reduce or eliminate the deposition of extraneous material during extended wafer processing.

A further object of the present invention is to prevent the wafer-sticking problem due to the build up of electrical charges between the wafer and the wafer pedestal processing.

A further object of the present invention is to reduce or eliminate the effect of the build up of a metal film on the wafer-clamping ring (wafer shadowing) during extended wafer processing.

A further object of the present invention is to reduce the contact between the wafer and the clamping ring while maintaining a secure clamp down of the wafer during sputtering.

A further object of the present invention is to extend the useful lifetime of the clamping ring.

A further object of the present invention is to prevent edge extrusion and potential metal peeling during wafer processing.

A further object of the present invention is to extend the useful process kit life from 120 kWh to 240 kWh.

A further object of the present invention is to reduce wafer breakage due to the wafer-sticking problem and in doing to reduce the mean time to fail during wafer processing.

In accordance with the objects of this invention a new method of clamping the wafer during wafer processing is achieved. The area of the clamp ring which is in contact with the wafer is redesigned which results in a sharply reduced clamping ring to wafer contact area and a subsequent elimination of the wafer to clamp ring sticking problem. In addition, a guide can be made a part of the clamp ring, which further extends a useful lifetime of the Clamp Ring.

The advantages of the preferred embodiment of the present invention are:
1. A method of reducing the Wafer to Clamp Ring contact area.
2. A method of extending the Useful Lifetime of the Clamp Ring.
3. A method of eliminating the Wafer Sticking Problem for wafer processes of up to 240 kWh.
4. A method of reducing Mean Time To Fail during wafer processing.
5. A method of increasing the Mechanical/Chemical kit uptime during processing.
6. The prevention of edge extrusion and metal peeling during wafer processing.

BRIEF DESCRIPTION OF THE DRAWINGS

FIG. 1 shows a Prior Art clamping ring arrangement.

FIG. 2 shows another Prior Art clamping ring arrangement.

FIG. 3 shows a cross section view of an improved prototype-clamping ring with a sharply reduced wafer to clamp ring contact area.

DETAILED DESCRIPTION OF THE PREFERRED EMBODIMENTS

Figure 4:
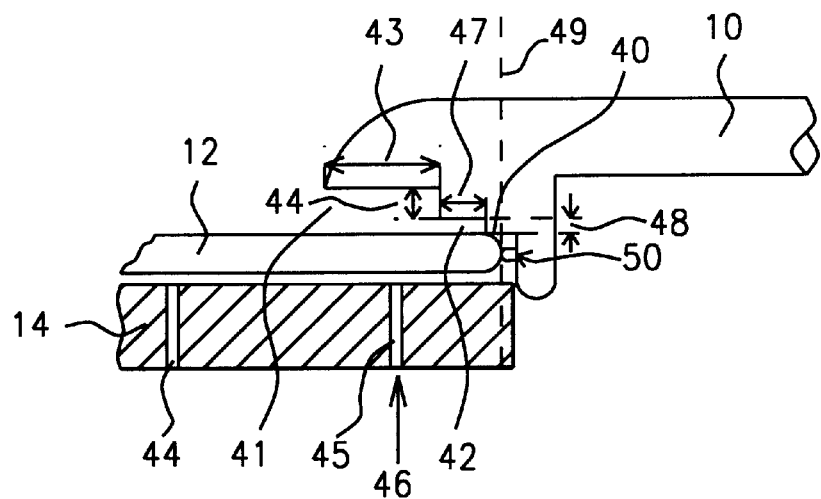
FIG. 4 shows a cross section view of an improved prototype clamp ring with extended wafer to wafer ring contact area.

The invention is a clamp ring that is useful for pressing the edges of a semiconductor wafer having a flat portion into a sealing abutment with a wafer pedestal to eliminate the build up of extraneous material in the wafer to wafer clamp surface area. The clamp ring provides a continuous and reliable seal. The clamp ring of the present invention also provides excellent pressure performance and cooling gas sealing when used with round wafers.

Referring now to FIG. 3, there is shown how the contact surface area 36 between wafer 12 and the clamping ring 10 has been reduced to a minimum in an effort to reduce the area where build-up of extraneous material can occur. The indicated reduction of the contact area between the wafer 12 and the wafer clamping ring 10 has been implemented by creating a second cut-out or extrusion 31 in the contour of the clamping ring facing the wafer, this second cut-out 31 has a width of 32 and a height of 33. As demonstrated in FIG. 3, cutout 31 is considerably smaller in scale than the first cutout 22 as shown in FIG. 2. This reduction in contact area would be expected to reduce the wafer to clamp ring-sticking problem. This approach was evaluated up to 158 and 224 Process Kit kWh life in two successive tests, at the end of this period the tests were discontinued due to a persistence of the wafer-sticking problem.

Typical dimensions for the width 32 and the height 33 are as follows: 32—0.65 mm.+−0.02 mm., 33—0.20 mm. +−0.02 mm.

This persistence of the wafer sticking problem is explained as follows: the wafer sticking problem is caused by the wafer diameter and it's tolerance, that is 150 mm. +−0.5 mm. respectively. The diameter of the clamp ring 10 is 150.88+−0.02 mm. Considering the previously indicate dimension of 32 (FIG. 3) as being 0.65 mm +−0.02 mm., the smallest wafer that can be handled is 150.23 mm. Wafers that are smaller will eventually not be supported or held due to the movement induced by the backside pressure during the sputtering process. Under the right conditions, the wafer can be supported within dimension 32 (FIG. 3) and the wafer will stay in place. For a good design the dimension of 32 must be approximately 1 mm., this issue is further addressed under FIG. 5 following.

Figure 5:
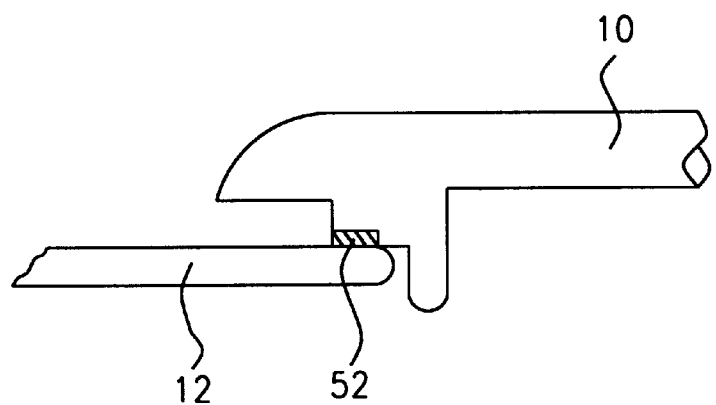
FIG. 5 shows a cross section view of an improved prototype-clamping ring with the addition of a wafer guide.

FIGS. 4 and 5 schematically illustrate in cross sectional representation a preferred embodiment of the implementation of the present invention.

Referring more specifically to FIG. 4, this figure presents the first embodiment of the present invention. The clamping ring 10 as shown in this figure is the improved clamping ring.

In FIG. 4 wafer 12 is securely clamped down by the clamp 10 during wafer processing, the wafer clamping ring contour facing the wafer has two cut-outs or extrusions, 41 and 42. Cut out 41 has a width of 43 and a height of 44, cut out 42 has a width of 47 and a height of 48. Wafer 12 will maintain contact with clamping ring 10 at location 40 until the deposition is completed.

The clamping ring dimensions typically are as follows: 43—1.5 mm+−0.02 mm., 44—0.15 mm+−0.02 mm.

This clamping ring 10 leads to increased wafer contact and increased support for the wafer, this as compared to the clamp ring previously presented in FIG. 3. This clamp ring was tested up to 240 kWh process kit (PK) life after which no problem of sticking wafer was observed.

The clamp ring 10 is manufactured, for example by machining, casting, etc., using any process compatible material such as any of various ceramic materials. The ring can also be made using an alumina material which has been found to be widely process compatible, i.e. it does not etch and is easy to clean.

When selecting a clamping ring material it is important to consider the process environment in which the clamping ring will be used. The clamping ring material should be both process compatible and should be resistant to the harsh conditions that are found within the processing environment. The ease with which the material may be cleaned and the rate at which metal or any other deposit builds up on the clamping ring must be considered.

Furthermore, the physical, thermal and chemical stability of the clamping ring is of importance, it is of importance to use a durable material that has a low thermal coefficient of expansion and that does not produce particles that may be a source of chamber and wafer contamination.

In the preferred embodiment of the present invention, the clamping ring can be formed of a material having a low thermal constant of expansion and low thermal conductivity, such as a ceramic materials e.g. alumina, aluminum nitride, calcium carbonate, etc. or any other thermally stable material.

One advantage of using metal fixtures is that they are able to conduct any electrical charges that may build up on the wafer surface between the wafer and the wafer pedestal. A ceramic clamping ring is nonconductive and can therefore not conduct electrical charges away from the wafer surface to the wafer pedestal. In using ceramic fixtures for the clamping ring, the present invention will therefore benefit from a method to discharge the wafer to wafer pedestal electrical charge prior to wafer removal from the manufacturing position.

It is of importance to maintain a nearly constant temperature across the surface of the semiconductor wafer during wafer processing in order to assure consistent processing results and thus high process yields and low semiconductor device failure rates. It is also important to avoid subjecting the wafer to excessive temperatures that could damage the delicate features of the devices formed on the surface of the semiconductor wafer. The wafer heat sink or pedestal 14, combined with an adequate wafer to wafer clamping ring contact area 40 (FIG. 4), allows for temperature maintenance across the surface of the wafer.

It has been found that, when a conventional clamping ring is used in a PVD system, the temperature of the wafer near the clamping ring can be significantly different than the temperature at the center of the wafer. This effect is caused by plasma introduced electron bombardment of the clamping ring during deposition. If a clamping ring material is used which is thermally non-conductive, the present invention significantly reduces or eliminates non-uniformity of temperatures across the surface of the wafer.

In the preferred embodiment of the present invention the wafer is clamped directly against the pedestal or a platen 14 which is part of the wafer pedestal and a gas 46 is provided to the interface between the wafer and the wafer platen through the gas port 45 to provide gas-assisted thermal transport between these two elements. This gas 46 is provided through a vertical port through the wafer pedestal 14.

The previously indicated phenomena of wafer shadowing, that is the effect that metal or other deposits have on the contour of the wafer ring and subsequently on the peripheral area of the wafer which is to be processed, is further minimized by the cut out 41 combined with the cut out 42 provided in the wafer clamping ring. The shadowing effect is in this way urged away from the center of the wafer leaving more of the wafer surface undisturbed for wafer processing. The larger opening afforded by the present invention allows the clamping ring to be used for a longer period of time before replacement is required. Due to the larger diameter of the clamping ring the clamping ring can accommodate a greater amount of metal build up on its surface before the inner diameter is reduced to a degree that wafer shadowing begins to effect the wafer surface.

The leakage of thermal conductive gasses, such as argon, from the backside of the wafer to the process environment, is detrimental to the maintenance and control of the chemical balance that is required in the processing area. In addition, a poor seal between the wafer and the wafer-clamping ring also allows reactants of the processing area to penetrate the region of the backside of the wafer where these reactants can contaminate the wafer backside and the wafer pedestal. It is therefore important to have control over the seal between the wafer and the wafer clamp ring such that clamping pressure can be applied to the edge of the wafer and thus prevent leakage of thermal conductive gas from the backside of the wafer (into the processing environment) while also restricting the possibility of volatile process parameters reacting with the backside of the wafer and the wafer pedestal. This control is provided in the present invention by means of the clamping screws 49. In many applications the weight of the clamping ring may be adequate to achieve the desired effect of control, where additional control is needed this can be exercised with the clamping screws 49. The wafer can be held in a planar or flat position with the vacuum suck 44. During wafer position control with the vacuum suck 44 and the clamping strews 49 care must be taken so as not to mechanically damage the semiconductor wafer due to undue stress being put on the wafer.

It is known how to seal the edges of a round wafer to a pedestal with an elastomeric seal to prevent cooling gas leakage. Known and conventional techniques can be used for this purpose as part of the present invention.

The clamping ring 10 of the present invention shields the very edge of the wafer from all depositions. This is done to avoid producing on the edge of the wafer deposits that can flake off and produce particles that interfere with wafer processing. An alignment guide 50 is therefore provided as part of the clamping ring that helps to center the wafer into the clamping ring. This alignment guide 50 further restricts the flow of material between wafer back to the processing area and from the wafer processing area to the back of the wafer.

Referring now to FIG. 5, this figure presents the second embodiment of the present invention. There is shown the improved prototype clamp ring 10 with the addition of a clamp guide 52. Clamp guide 52 will reduce the wear and tear on clamp ring 10 during clamp ring recycling since this recycling involves sand blasting and acid cleaning operations. This arrangement leads to an extension of the lifetime of the clamping ring.

Wafer insertion within the wafer clamp tool can further be facilitated by the use of wafer positioning guide 50 (FIG. 4), this guide can be part of the clamping ring or it can be a (finger like) extension of the wafer pedestal. This wafer-positioning guide is not considered part of the present invention.

Guide 52 can be manufactured following a machined pattern using the original material, this is the same for the clamp ring.

The dimensions for the clamping rings of FIG. 4 and FIG. 5 are, with the exception of the extra pattern 52, identical.

Although the present invention is described herein with reference to the preferred embodiments, those skilled in the art of semiconductor manufacturing will readily appreciate that other applications may be substituted for those set forth herein without departing from the spirit and scope of the present invention. Accordingly, the present invention should only be limited by the claims included below.

What is claimed is:

1. An apparatus for securing a semiconductor wafer having a circular surface having a periphery in addition to having a back surface, a front surface and a center, against motion during wafer processing, comprising:

a compound clamping ring having a compound structure comprising a first and a second cut-back with both first and second cut-backs facing said front surface of said wafer, further having an inner diameter defining a circular opening having a center, said compound clamping ring having one continuous planar clamping surface for pressure opposition along said periphery of said wafer front surface of said wafer to effect wafer clamping;

a wafer pedestal to which said wafer is securely attached during wafer processing; and a means of further securing said wafer to said wafer pedestal during wafer processing to further control flow of gas from a processing area to said back surface of said wafer and to control flow of contaminants from said back surface of said wafer to a processing area.

2. The apparatus of claim 1 wherein said [compound structure consists of a first and a second cut-back wherein a] first cut back is furthest removed from said center of said circular opening of said clamping ring and has a cross section which is smaller than a second cut-back closest to the center of the wafer being processed with the objective of reducing contact between the wafer which is being processed and the clamping ring so as to inhibit formation of extraneous material between said wafer and said wafer clamping ring in addition to reducing effects of wafer shadowing, and said clamping ring having said inner diameter defining said circular opening and having one continuous planar clamping surface for pressure opposition along the periphery of the front surface of said wafer surface to effect wafer clamping in an even and controllable way to inhibit flow of gases between the back surface of said wafer and a wafer processing area.

3. The apparatus of claim 1, wherein said means of further securing said wafer to said wafer pedestal during wafer processing is a suck canal within said wafer pedestal and is provided to allow control over wafer flatness during wafer processing by exerting a negative pressure on the back surface of said wafer.

4. The apparatus of claim 1, wherein in addition a coolant feed opening is provided within said wafer pedestal to allow temperature control over the surface of the wafer during wafer processing.

5. The apparatus of claim 1, wherein said compound clamping ring has a low coefficient of expansion.

6. The apparatus of claim 1, wherein said compound clamping ring is electrically conductive.

7. The apparatus of claim 1 further comprising a secondary seal or guide provided in the second cut-back of said clamping ring to further enclose discontinuous wafer edge portions along the periphery of the front surface of said wafer and to thereby increase the life time of said clamping ring.

8. The apparatus of claim 7, wherein in addition a suck canal within said wafer pedestal is provided to allow control over flatness during wafer processing by applying negative pressure to the back surface of said wafer, urging said wafer towards said pedestal.

9. The apparatus of claim 7, wherein in addition a coolant feed opening is provided within said wafer pedestal to allow temperature control over the surface of the wafer during wafer processing by feeding coolant to the back surface of said wafer.

10. The apparatus of claim 7, wherein said clamping ring is electrically conductive.

11. An apparatus of claim 7, wherein said clamping ring has a low coefficient of expansion.

* * * * *